US012107187B2

(12) United States Patent
Cheng

(10) Patent No.: US 12,107,187 B2
(45) Date of Patent: Oct. 1, 2024

(54) SEMICONDUCTOR STRUCTURES AND MANUFACTURING METHODS THEREOF

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 398 days.

(21) Appl. No.: 17/632,209

(22) PCT Filed: Dec. 5, 2019

(86) PCT No.: PCT/CN2019/123298
§ 371 (c)(1),
(2) Date: Feb. 1, 2022

(87) PCT Pub. No.: WO2021/109073
PCT Pub. Date: Jun. 10, 2021

(65) Prior Publication Data
US 2022/0285585 A1      Sep. 8, 2022

(51) Int. Cl.
*H01L 33/32*      (2010.01)
*H01L 33/00*      (2010.01)
*H01L 33/38*      (2010.01)

(52) U.S. Cl.
CPC .......... *H01L 33/32* (2013.01); *H01L 33/0075* (2013.01); *H01L 33/382* (2013.01); *H01L 2933/0016* (2013.01)

(58) Field of Classification Search
CPC .... H01L 33/32; H01L 33/0075; H01L 33/382
See application file for complete search history.

(56) References Cited

U.S. PATENT DOCUMENTS

| 6,596,079 B1 | 7/2003 | Vaudo et al. |
| 7,655,197 B2 | 2/2010 | Vaudo et al. |
| 8,501,506 B2 | 8/2013 | Hung et al. |

(Continued)

FOREIGN PATENT DOCUMENTS

| CN | 1363730 A | 8/2002 |
| CN | 1426497 A | 6/2003 |

(Continued)

OTHER PUBLICATIONS

ISA State Intellectual Property Office of the People's Republic of China, International Search Report Issued in Application No. PCT/CN2019/123298, Sep. 8, 2020, WIPO, 6 pages.

(Continued)

*Primary Examiner* — Eugene Lee
(74) *Attorney, Agent, or Firm* — The Small Patent Law Group LLC; Christopher R. Carroll

(57) ABSTRACT

The present disclosure provides a semiconductor structure and a manufacturing method thereof. In the manufacturing method, a P-type semiconductor layer is provided, where the P-type semiconductor layer includes a GaN-based material and an upper surface of the P-type semiconductor layer is a Ga surface. A first N-type semiconductor layer is formed on the P-type semiconductor layer, where the first N-type semiconductor layer comprises a GaN-based material. An upper surface of the first N-type semiconductor layer is an N surface. A part of the first N-type semiconductor layer is removed by wet etching to expose a part of the P-type semiconductor layer.

10 Claims, 5 Drawing Sheets

(56) References Cited

U.S. PATENT DOCUMENTS

| | | |
|---|---|---|
| 9,312,129 B2 | 4/2016 | Faurie et al. |
| 2003/0157376 A1 | 8/2003 | Vaudo et al. |
| 2004/0124435 A1 | 7/2004 | Phillip et al. |
| 2012/0235157 A1 | 9/2012 | Hung et al. |
| 2013/0026489 A1 | 1/2013 | Gambin et al. |
| 2013/0115753 A1 | 5/2013 | Eo et al. |
| 2014/0065801 A1 | 3/2014 | Faurie et al. |

FOREIGN PATENT DOCUMENTS

| | | |
|---|---|---|
| CN | 1748290 A | 3/2006 |
| CN | 102683533 A | 9/2012 |
| CN | 103681809 A | 3/2014 |
| CN | 104603911 A | 5/2015 |
| CN | 108511531 A | 9/2018 |
| CN | 109560118 A | 4/2019 |
| TW | I277212 B | 3/2007 |
| TW | 201005828 A1 | 2/2010 |

OTHER PUBLICATIONS

ISA State Intellectual Property Office of the People's Republic of China, Written Opinion of the International Searching Authority Issued in Application No. PCT/CN2019/123298, Sep. 8, 2020, WIPO, 6 pages. (Submitted with Partial / Machine translation).
TW Patent Office, Office Action Issued in Application No. 109142502, Jul. 28, 2021, 10 pages. (Submitted with Partial / Machine translation).
TW Patent Office, Decision of Rejection Issued in Application No. 109142502, Nov. 18, 2021, 6 pages. (Submitted with Partial / Machine translation).

SEMICONDUCTOR STRUCTURES AND MANUFACTURING METHODS THEREOF

CROSS-REFERENCE TO RELATED APPLICATIONS

This application is a national phase entry of and claims priority to International Patent Application No. PCT/CN2019/123298 (filed 5 Dec. 2019), the entire disclosure of which is incorporated herein by reference.

TECHNICAL FIELD

The present disclosure relates to the field of semiconductor technologies, and in particular to a semiconductor structure and a manufacturing method thereof.

BACKGROUND

III-nitride is a third generation novel semiconductor material subsequent to the first and second generation semiconductor materials such as Si, GaAs, etc. GaN, as a wide forbidden band semiconductor material, has many advantages such as high saturation drift velocity, great breakdown voltage, and excellent carrier transport performance. GaN can form tertiary alloys of AlGaN and InGaN and quaternary alloy of AlInGaN and the like. GaN can be easily made into GaN-based PN junctions. In view of this, the GaN-based materials and the semiconductor devices are extensively and deeply studied in recent years. The GaN-based materials grown based on MOCVD (Metal-Organic Chemical Vapor Deposition) technology have become more and more mature. In the research of semiconductor devices, the research in the photo-electronic devices such as GaN-based light-emitting diodes, GaN-based laser diodes, etc., and in the microelectronic devices such as GaN-based High Electron Mobility Transistors, etc., have gained significant progress and considerable development.

At present, there are still aspects of GaN-based semiconductor devices that need to be improved. One of technical problems is that it is difficult to manufacture the contact electrode of the P-type GaN-based semiconductor layer.

In view of this, it is necessary to provide a new semiconductor structure and a manufacturing method thereof to solve the above technical problems.

SUMMARY

The present disclosure aims to provide a semiconductor structure and a manufacturing method thereof to improve performances of GaN-based semiconductor devices.

In order to achieve the above object, a first aspect of the present disclosure provides a manufacturing method of a semiconductor structure. The manufacturing method includes:
  providing a P-type semiconductor layer, where the P-type semiconductor layer includes a GaN-based material, and an upper surface of the P-type semiconductor layer is a Ga surface;
  forming a first N-type semiconductor layer on the P-type semiconductor layer, where the first N-type semiconductor layer comprises a GaN-based material, and an upper surface of the first N-type semiconductor layer is an N surface; and
  removing a part of the first N-type semiconductor layer by wet etching to expose a part of the P-type semiconductor layer.

GaN crystal is a wurtzite structure, where Ga and N atom layers are presented like ABABAB hexagonal stacking, and each Ga(N) atom is bonded with its surrounding four N(Ga) atoms like diamond-like tetrahedral structure. It is noted that with a Ga—N bond parallel to the C axis (a [0001] crystal orientation) as a reference, if a Ga atom in each Ga—N bond is farther from a lower surface, the upper surface is a Ga surface; if an N atom in each Ga—N bond is farther from the lower surface, the upper surface is an N surface.

Optionally, before the first N-type semiconductor layer is formed on the P-type semiconductor layer, a P-type doped ion in the P-type semiconductor layer is activated.

Optionally, the P-type semiconductor layer is located on a second N-type semiconductor layer. The part of the first N-type semiconductor layer which is removed by wet etching is located in a base electrode region.

The method further includes: removing the first N-type semiconductor layer in a collector electrode region and the P-type semiconductor layer in the collector electrode region by dry etching to expose a part of the second N-type semiconductor layer.

Optionally, providing the P-type semiconductor layer includes: providing a semiconductor substrate, forming a second N-type semiconductor layer on the semiconductor substrate, and forming the P-type semiconductor layer on the second N-type semiconductor layer; or
  providing a second N-type semiconductor layer, and forming the P-type semiconductor layer on the second N-type semiconductor layer.

Optionally, the method further includes: forming a collector electrode on the second N-type semiconductor layer of the collector electrode region; forming a base electrode on the P-type semiconductor layer of the base electrode region; and forming an emitter electrode on the first N-type semiconductor layer of an emitter electrode region.

Optionally, the first N-type semiconductor layer with the upper surface as N surface is formed on the P-type semiconductor layer by directly bonding a Ga surface of the first N-type semiconductor layer with the Ga surface of the P-type semiconductor layer.

Optionally, the first N-type semiconductor layer with the upper surface as N surface is formed on the P-type semiconductor layer by enabling the N surface of the first N-type semiconductor layer to face upward through polarity inversion in a process of forming the first N-type semiconductor layer.

Another aspect of the present disclosure provides a semiconductor structure. The semiconductor structure includes:
  a P-type semiconductor layer and a first N-type semiconductor layer distributed from bottom to top, where the P-type semiconductor layer comprises a GaN-based material, and an upper surface of the P-type semiconductor layer is a Ga surface; the first N-type semiconductor layer comprises a GaN-based material, and an upper surface of the first N-type semiconductor layer is an N surface; and a part of the Ga surface of the P-type semiconductor layer is exposed.

Optionally, the semiconductor structure further includes a second N-type semiconductor layer, where the P-type semiconductor layer is located on the second N-type semiconductor layer; the second N-type semiconductor layer in a collector electrode region, and the P-type semiconductor layer in a base electrode region are exposed.

Optionally, the semiconductor structure further includes: a collector electrode on the exposed second N-type semiconductor layer, a base electrode on the exposed P-type semiconductor layer, and an emitter electrode (E) on the first N-type semiconductor layer.

Compared with the prior art, the present disclosure has the following beneficial effects.

1) In the manufacturing method of a semiconductor structure of the present disclosure, a first P-type semiconductor layer is firstly provided, where the P-type semiconductor layer includes a GaN-based material. Then, a first N-type semiconductor layer is formed on the P-type semiconductor layer, where the first N-type semiconductor layer includes a GaN-based material. When the P-type semiconductor layer is provided, its upper surface is controlled to be a Ga surface. When the first N-type semiconductor layer is formed, its upper surface is controlled to be an N surface. By use of the directivity of wet etching, etching is started from the N surface of the first N-type semiconductor layer and automatically stopped on the Ga surface of the P-type semiconductor layer, thereby avoiding over-etching. If dry etching is adopted, when the dry etching is stopped, the P-type semiconductor layer will be over-etched. In a dry etching process, nitrogen atoms in the GaN-based material will preferentially escape, leading to a larger number of electron carriers. For the P-type semiconductor layer, some of the hole carriers will be neutralized, leading to a decreased hole carrier concentration and even to surface inversion. Therefore, compared with the dry etching, the wet etching can avoid the above problems in the process of forming an electrical connection structure of the P-type semiconductor layer.

2) In an optional solution, before the N-type semiconductor layer is formed on the P-type semiconductor layer, P-type doped ions in the P-type semiconductor layer are activated. The solution can provide an escape path for released H atoms to improve the quality of the PNP junction. The reason is that when the P-type GaN-based material is grown based on MOCVD technology, a large number of H atoms are present in the MOCVD growth environment. If these H atoms are not removed, an acceptor dopant Mg in GaN will be passivated by the large number of H atoms and thus will not produce holes. Furthermore, a large number of passivated and un-bonded Mg ions will enter the N-type GaN-based material layer grown above. In this case, the junction surface of the PN junction will be blurred and a part of the N-type GaN-based material layer is compensated, resulting in a reduced electron concentration and even failure of the PN junction.

3) In an optional solution, the P-type semiconductor layer is located on a second N-type semiconductor layer; the part of the first N-type semiconductor layer which is removed by wet etching is located in a base electrode region. The method optionally further includes: removing the first N-type semiconductor layer in a collector electrode region and the P-type semiconductor layer in the collector electrode region by dry etching to expose a part of the second N-type semiconductor layer.

4) In an optional solution, the first N-type semiconductor layer with the upper surface as N surface is formed on the first P-type semiconductor layer by: a) directly bonding a Ga surface of the first N-type semiconductor layer with the Ga surface of the P-type semiconductor layer; or b) enabling the N surface of the first N-type semiconductor layer to face upward through polarity inversion in a process of forming the first N-type semiconductor layer. Research shows that the above two processes are both reliable.

Figure 1:
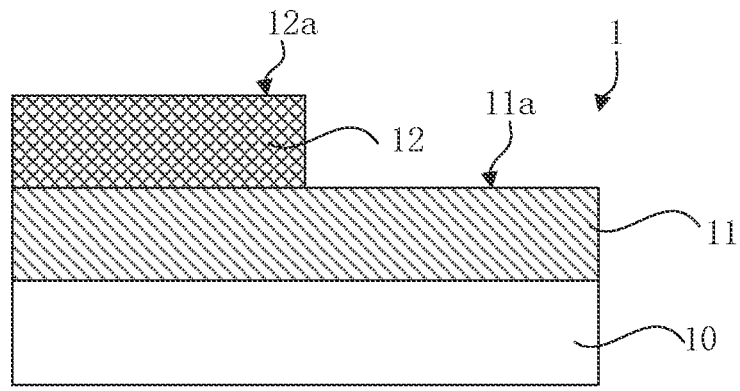
FIG. 1 is a structural schematic diagram illustrating a semiconductor structure according to a first embodiment of the present disclosure.

To help understand the present disclosure, all reference numerals appearing the present disclosure are listed below.
Semiconductor structure 1, 2, 3, 4, 5, and 6,
Semiconductor substrate 10,
P-type semiconductor layer 11,
Upper surface 11a of the P-type semiconductor layer,
First N-type semiconductor layer 12,
Upper surface 12a of the first N-type semiconductor layer,
Positive electrode 131,
Negative electrode 132,
Second N-type semiconductor layer 14,
Collector electrode region 1a,
Base electrode region 1b,
Emitter electrode region 1c,
Collector electrode C,
Base electrode B, and
Emitter electrode E.

DETAILED DESCRIPTION OF THE EMBODIMENTS

In order to make the object, features, and advantages of the present disclosure clearer and more understandable, the specific embodiments of the present disclosure will be detailed below in combination with the accompanying drawings.

FIG. 1 is a structural schematic diagram illustrating a semiconductor structure according to a first embodiment of the present disclosure.

With reference to FIG. 1, the semiconductor structure 1 includes a semiconductor substrate 10, a P-type semiconductor layer 11 and a first N-type semiconductor layer 12 from bottom to top.

The P-type semiconductor layer 11 includes a GaN-based material, and an upper surface 11a of the P-type semiconductor layer 11 is a Gallium (also abbreviated as Ga) surface. The first N-type semiconductor layer 12 includes a GaN-based material, and an upper surface 12a of the first N-type semiconductor layer 12 is a Nitrogen (also abbreviated as N) surface. A part of the Ga surface of the P-type semiconductor layer 11 is exposed.

As can be seen, a PN junction is formed by the P-type semiconductor layer 11 and the first N-type semiconductor layer 12 of the illustrated embodiment.

The semiconductor substrate 10 may be made of sapphire, silicon carbide, silicon, GaN, or diamond.

The GaN-based material may include at least one of GaN, AlGaN, InGaN, or AlInGaN.

The upper surface 11a of the P-type semiconductor layer 11 is a Ga surface, which means that with a Ga—N bond parallel to the C axis (the [0001] crystal orientation) as a reference, the Ga atom in each Ga—N bond is farther from the semiconductor substrate 10. It is understood that, at this time, a lower surface of the P-type semiconductor layer 11 is an N surface.

The upper surface 12a of the first N-type semiconductor layer 12 is an N surface, which means that with a Ga—N bond parallel to the C axis (the [0001] crystal orientation) as a reference, the N atom in each Ga—N bond is farther from the semiconductor substrate 10. It is understood that at this time that a lower surface of the first N-type semiconductor layer 12 is a Ga surface.

The exposed region of the upper surface 11a of the P-type semiconductor layer 11 and the upper surface 12a of the N-type semiconductor layer 12 may form an electrical connection structure, for example, a metal interconnection structure, so as to lead out electrical signals of the P-type semiconductor layer 11 and the first N-type semiconductor 12, respectively.

Figure 2:
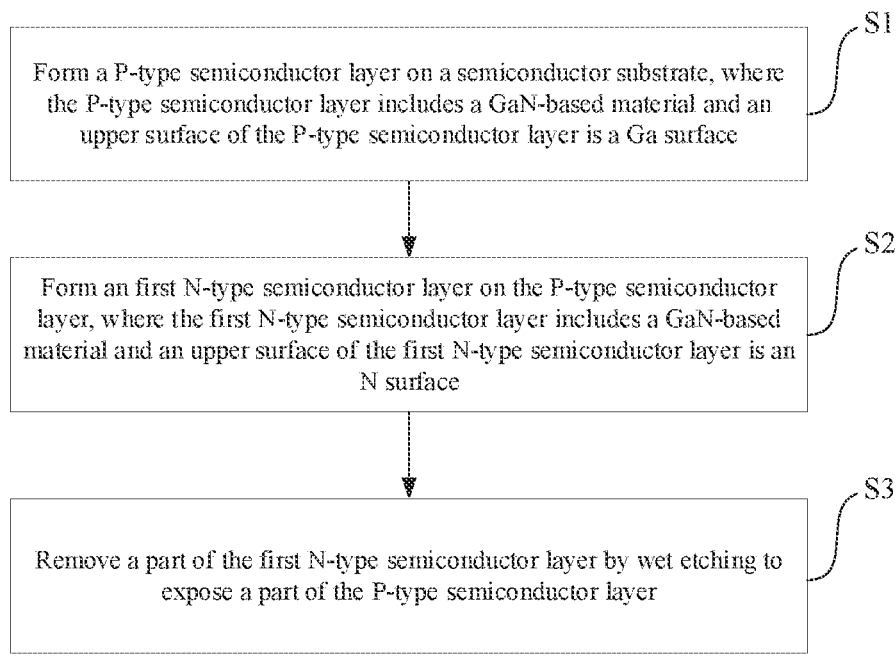
FIG. 2 is a flowchart illustrating a manufacturing method of the semiconductor structure shown in FIG. 1.

For the semiconductor structure 1 shown in FIG. 1, an embodiment of the present disclosure provides a corresponding manufacturing method. FIG. 2 illustrates a flowchart of the manufacturing method.

Firstly, at step S1, with reference to FIGS. 1 and 2, a P-type semiconductor layer 11 is formed on a semiconductor substrate 10, where the P-type semiconductor layer 11 includes a GaN-based material and an upper surface 11a of the P-type semiconductor layer 11 is a Ga surface.

The semiconductor substrate 10 may be made of sapphire, silicon carbide, silicon, GaN, diamond, or the like, which is not limited to the illustrated embodiment.

The GaN-based material of the P-type semiconductor layer 11 may include at least one of GaN, AlGaN, InGaN, or AlInGaN, which is not limited to the illustrated embodiment.

The material of the P-type semiconductor layer 11, for example, GaN, may be grown based on MOCVD technology. Illustratively, $NH_3$ and TMGa are an N source and a Ga source, respectively, and $H_2$ is a carrier gas. Specifically, P-type ions may be doped while GaN is grown. The P-type ions may be Mg, a source of which may be CP2Mg. In other optional solutions, the P-type doped ions may include at least one of calcium, carbon, beryllium, yttrium, or zinc.

In an optional solution, a buffer layer may be grown firstly on the semiconductor substrate 10, and then the P-type semiconductor layer 11 is grown on the buffer layer. The disposal of the buffer layer may reduce a threading dislocation (TD) density in the P-type semiconductor layer 11 and TD bending resulting from a lateral growth mechanism.

In an optional solution, the upper surface 11a of the P-type semiconductor layer 11 may be controlled to be a Ga surface by enabling the Ga surface of the P-type semiconductor layer 11 to face upward through epitaxial growth in a process of forming the P-type semiconductor layer 11.

Next, at step S2, still referring to FIGS. 1 and 2, a first N-type semiconductor layer 12 is formed on the P-type semiconductor layer 11, where the first N-type semiconductor layer 12 includes a GaN-based material, and an upper surface 12a of the first N-type semiconductor layer 12 is an N surface.

The GaN-based material of the first N-type semiconductor layer 12 may refer to that of the P-type semiconductor layer 11. The materials of the first N-type semiconductor layer 12 and the P-type semiconductor layer 11 may be same or different.

The material of the first N-type semiconductor layer 12, for example, GaN, may be grown based on MOCVD technology. Illustratively, $NH_3$ and TMGa are an N source and a Ga source, respectively, and $H_2$ is a carrier gas. N-type doped ions may include at least one of silicon, germanium, or oxygen.

In an optional solution, the upper surface 12a of the first N-type semiconductor layer 12 may be controlled to be an N surface by directly bonding a Ga surface of the first N-type semiconductor layer 12 with the Ga surface of the P-type semiconductor layer 11.

In an optional solution, an epitaxial layer of the first N-type semiconductor layer 12 for bonding may be prepared by the following method including: disposing a sacrificial layer in a process of preparing a GaN-based material epitaxial layer with an upper surface as a Ga surface, and then continuing preparing a GaN-based material epitaxial layer of a predetermined thickness with an upper surface as a Ga surface on the sacrificial layer. The sacrificial layer may include, for example, porous GaN, H-injected GaN, and the like. After preparation, the GaN-based material epitaxial layer with the upper surface as a Ga surface above the sacrificial layer may be peeled off the sacrificial layer through a process such as annealing, and a surface of the peeled GaN-based material epitaxial layer with the upper surface as a Ga surface, which is in contact with the sacrificial layer, is an N surface.

In an optional solution, the upper surface 12a of the first N-type semiconductor layer 12 may be controlled to be an N surface by enabling the N surface of the first N-type semiconductor layer 12 to face upward through polarity inversion in a process of forming the first N-type semiconductor layer 12.

The polarity inversion includes firstly growing the first N-type semiconductor layer 12 with the upper surface 12a as a Ga surface epitaxially; and next, adding a polarity inversion element during epitaxial growth to make the N surface upward, where the polarity inversion element includes, for example, Mg.

Furthermore, the polarity inversion may also include: first preparing a polarity inversion layer on the P-type semiconductor layer 11 by using a material, for example, $Al_2O_3$; and next, continuing growing the GaN-based material on the polarity inversion layer to make the N surface upward.

Next, at step S3, still referring to FIGS. 1 and 2, a part of the first N-type semiconductor layer 12 is removed by wet etching to expose a part of the P-type semiconductor layer 11.

A wet etching solution, for example, a KOH solution, is corrosive on the N surface but non-corrosive on the Ga surface. The upper surface of the P-type semiconductor layer 11 is a Ga surface, therefore, an etching process will automatically stop on the upper surface of the P-type semiconductor layer 11 without over-etching the P-type semiconductor layer 11.

In the related art, patterning is generally performed on the first N-type semiconductor layer 12 through dry etching. When the dry etching stops, the P-type semiconductor layer 11 may be over-etched. In a dry etching process, nitrogen atoms in the GaN-based material will preferentially escape, leading to a larger number of electron carriers in the P-type semiconductor layer 11. As a result, some of the hole carriers will be neutralized, leading to a decreased hole carrier concentration and even to surface inversion. Therefore, compared with the dry etching, the wet etching may avoid the above problems in the patterning process.

In the subsequent process, it is also possible to continue to form an electrical connection structure, such as a metal interconnection structure, on the exposed region of the upper surface 11a of the P-type semiconductor layer 11 and the upper surface 12a of the first N-type semiconductor layer 12, to lead the electrical signals of the P-type semiconductor layer 11 and the first N-type semiconductor layer 12, respectively.

Figure 3:
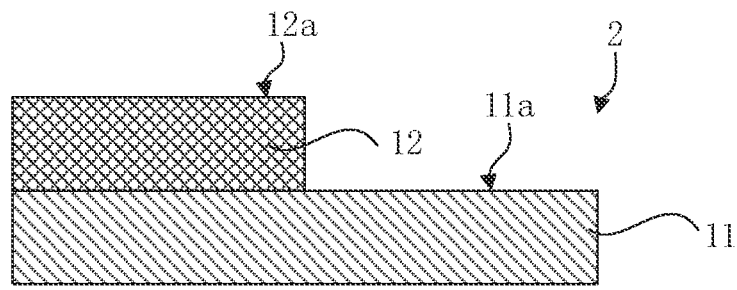
FIG. 3 is a structural schematic diagram illustrating a semiconductor structure according to a second embodiment of the present disclosure.

FIG. 3 is a structural schematic diagram illustrating a semiconductor structure according to a second embodiment of the present disclosure. With reference to FIG. 3, the semiconductor structure 2 of the second embodiment is substantially same as the semiconductor layer 1 of the first embodiment except that the semiconductor substrate 10 is omitted.

It is noted that with a Ga—N bond parallel to the C axis (the [0001] crystal orientation) as a reference, if a Ga atom in each Ga—N bond is farther from the lower surface, the upper surface is the Ga surface.

Figure 4:
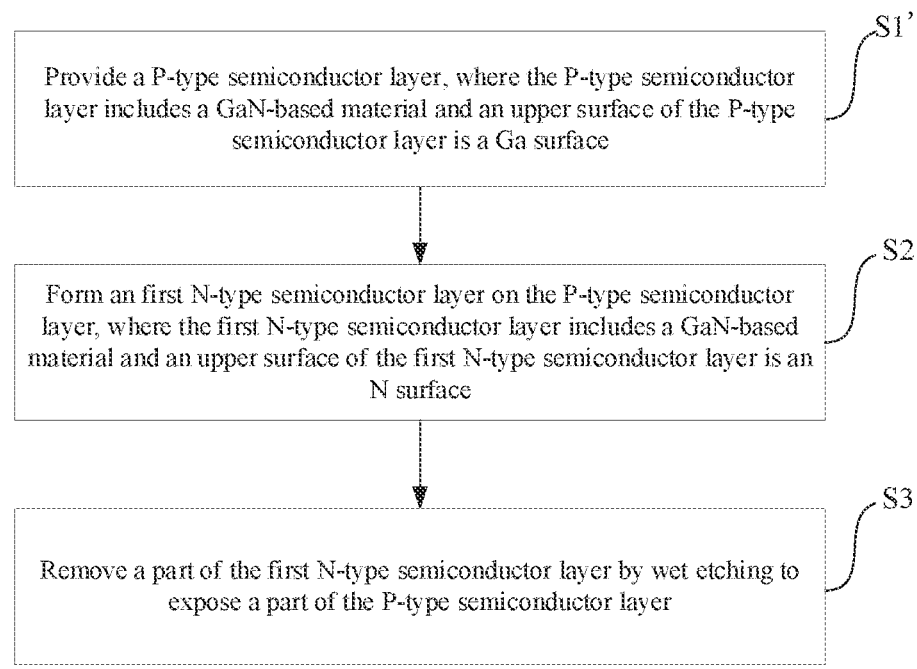
FIG. 4 is a flowchart illustrating a manufacturing method of the semiconductor structure shown in FIG. 3.

FIG. 4 is a flowchart illustrating a manufacturing method of the semiconductor structure in FIG. 3. By referring to FIG. 4, the manufacturing method of the second embodiment is substantially same as the manufacturing method of the first embodiment except for the following: at step S1', a P-type semiconductor layer 11 is provided, where the P-type semiconductor layer 11 includes a GaN-based material, and an upper surface 11a of the P-type semiconductor layer 11 is a Ga surface. In other words, the P-type semiconductor layer 11 of this embodiment may be an already-made semiconductor intermediate structure.

Figure 5:
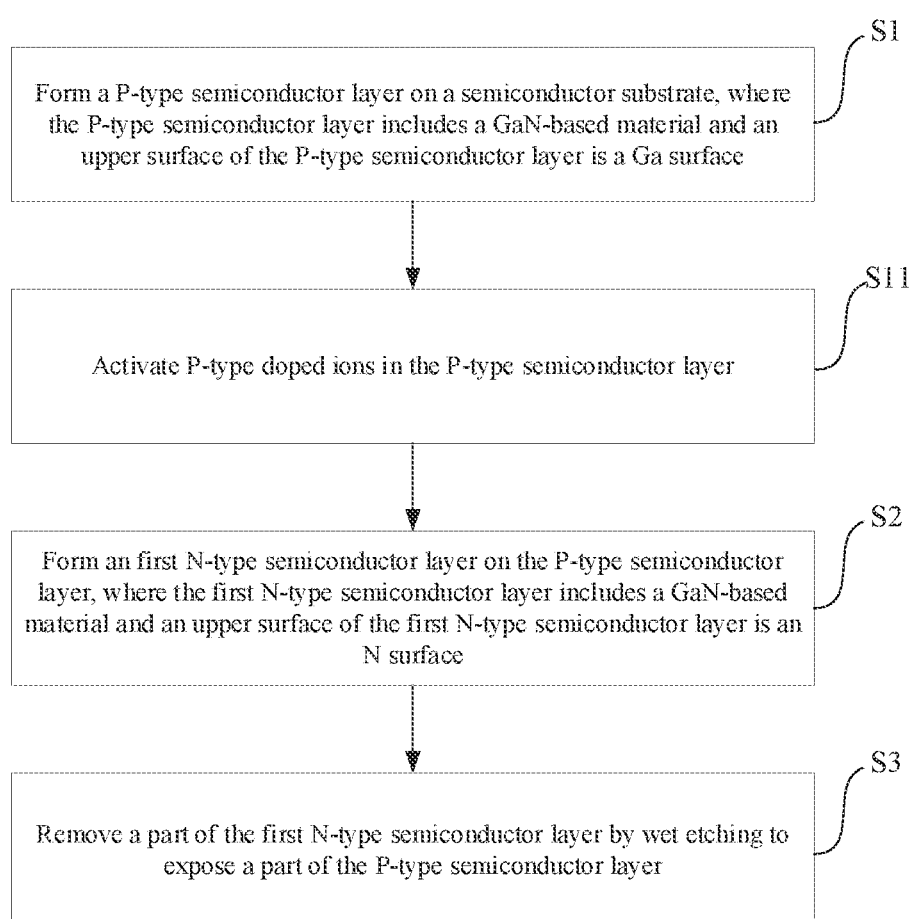
FIG. 5 is a flowchart illustrating a manufacturing method of a semiconductor structure according to a third embodiment of the present disclosure.

FIG. 5 is a flowchart illustrating a manufacturing method of a semiconductor structure according to a third embodiment of the present disclosure. By referring to FIGS. 2 and 5, the manufacturing method of the third embodiment is substantially same as the manufacturing methods of the first and second embodiments, except that step S11 is added to activate P-type doped ions in the P-type semiconductor layer 11. The step S11 is carried out between the steps S1 and S2.

The P-type doped ion may be magnesium which may be activated by high temperature annealing. When the P-type GaN-based material is grown based on MOCVD technology, because a large number of H atoms are present in the MOCVD growth environment, if the H atoms cannot be released, the acceptor dopant Mg in GaN may easily form a covalent bond with the H atom and thus cannot produce holes, that is, may be passivated by the H atoms. In this step, because the upper surface 11a of the P-type semiconductor layer 11 is not blocked, H atoms will be easily released and a large number of P-type doped ions Mg may form covalent bonds with the atoms in the GaN-based material, that is, activated rather than passivated.

Furthermore, a large number of Mg form covalent bonds with the atoms in the GaN-based material, which can prevent those free Mg ions from entering the first N-type GaN-based material layer grown above, thereby improving the quality of the PN junction.

Figure 6:
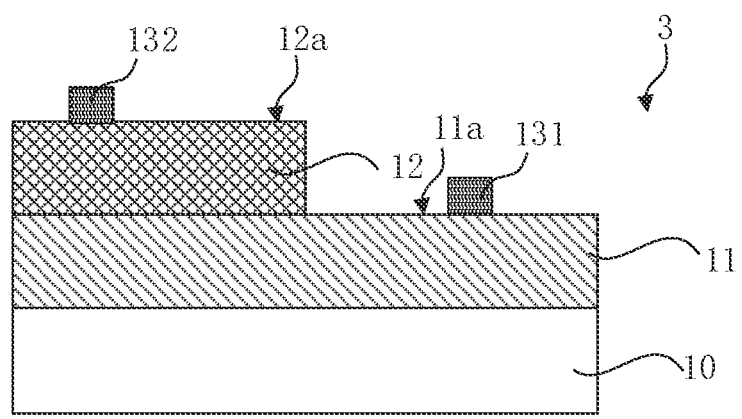
FIG. 6 is a structural schematic diagram illustrating a semiconductor structure according to a fourth embodiment of the present disclosure.

FIG. 6 is a structural schematic diagram illustrating a semiconductor structure according to a fourth embodiment of the present disclosure. The semiconductor structure 3 of the fourth embodiment is substantially same as the semiconductor structures of the first, second and third embodiments except that: the exposed region of the upper surface 11a of the P-type semiconductor layer 11 has a positive electrode 131 and the upper surface 12a of the first N-type semiconductor layer 12 has a negative electrode 132.

There is an ohmic contact between the positive electrode 131 and the P-type semiconductor layer 11 and between the negative electrode 132 and the first N-type semiconductor layer 12.

The material of both the positive electrode 131 and the negative electrode 132 may be a metal or a semiconductor material with good electrical conductivity after doping.

Correspondingly, the manufacturing method includes: at step S4, the positive electrode 131 is formed on the exposed region of the upper surface 11a of the P-type semiconductor layer 11, and the negative electrode 132 is formed on the upper surface 12a of the first N-type semiconductor layer 12.

The method of forming the positive electrode 131 and the negative electrode 132 may be electroplating or metal deposition.

Figure 7:
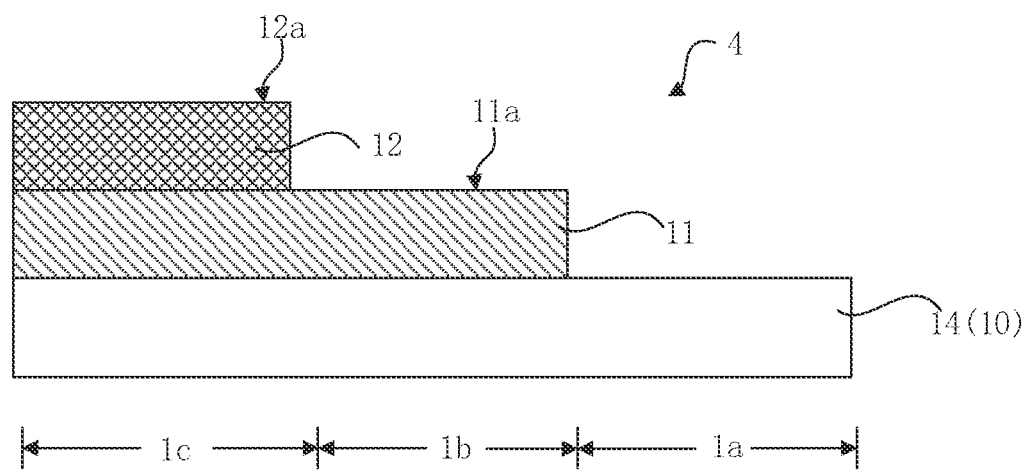
FIG. 7 is a structural schematic diagram illustrating a semiconductor structure according to a fifth embodiment of the present disclosure.

FIG. 7 is a structural schematic diagram illustrating a semiconductor structure according to a fifth embodiment of the present disclosure. Referring to FIG. 7, the semiconductor structure 4 of the fifth embodiment is substantially same as the semiconductor structures of the first, second, and fourth embodiments except that: the semiconductor substrate 10 is a second N-type semiconductor layer 14, the first N-type semiconductor layer 12 is located in the emitter electrode region 1c, the second N-type semiconductor layer 14 in the collector electrode region 1a, and the P-type semiconductor layer 11 in the base electrode region 1b are exposed.

In other embodiments, if the semiconductor substrate 10 is omitted, the semiconductor structure 4 includes a second N-type semiconductor layer 14, a P-type semiconductor layer 11, and a first N-type semiconductor layer 12 distributed from bottom to top.

As can be seen, the second N-type semiconductor layer 14, the P-type semiconductor layer 11, and the first N-type semiconductor layer 12 form an NPN bipolar transistor.

Figure 8:
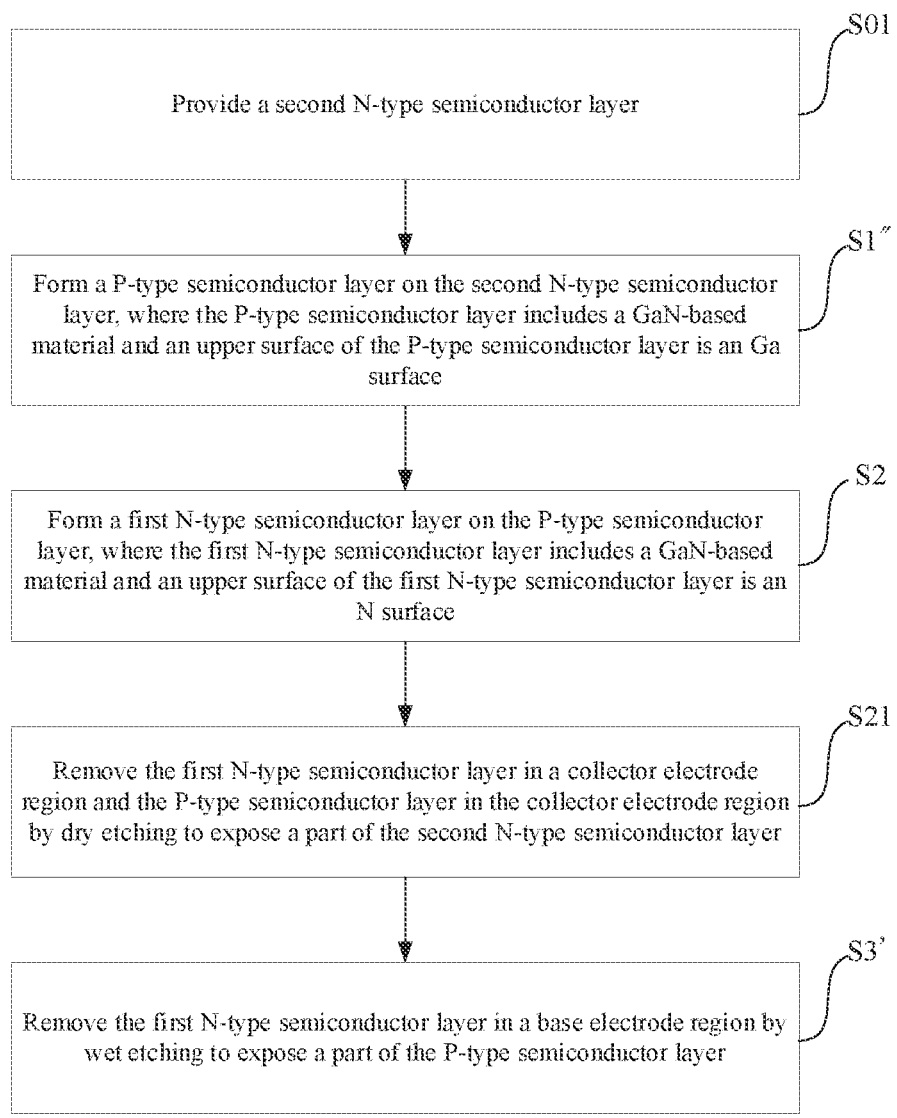
FIG. 8 is a flowchart illustrating a manufacturing method of the semiconductor structure shown in FIG. 7.

FIG. 8 is a flowchart illustrating a manufacturing method of the semiconductor structure shown in FIG. 7. Referring to FIG. 8 and FIG. 2, the difference between the two is that: at step S01, a second N-type semiconductor layer 14 is provided; at step S1", a P-type semiconductor layer 11 is formed on the second N-type semiconductor layer 14, where the P-type semiconductor layer 11 includes a GaN-based material and an upper surface 11a of the P-type semiconductor layer 11 is a Ga surface; at step S21, the first N-type semiconductor layer 12 in a collector electrode region 1a and the P-type semiconductor layer 11 in the collector electrode region 1a are removed by dry etching to expose a part of the second N-type semiconductor layer 14; and at step S3', the first N-type semiconductor layer 12 in the base electrode region 1b is removed by wet etching to expose a part of the P-type semiconductor layer 11.

At step S01, the second N-type semiconductor layer 14 may be made of a GaN-based material, and the GaN-based material may include at least one of GaN, AlGaN, InGaN, or AlInGaN. This embodiment does not limit an orientation of GaN covalent bond in the second N-type semiconductor layer 14.

Step S21 is performed first, followed by step S3'. At step S21, the dry etching may be ICP etching, the reaction gas may be Cl2, and the auxiliary gas may be N2.

When the dry etching is stopped, the second N-type semiconductor layer 14 is over-etched, but due to the preferential escape of nitrogen atoms from the GaN-based material in a process of the dry etching (which causes a larger number of electron carriers for the second N-type semiconductor layer 14), the resistivity of the surface is reduced (which is conducive to reducing the contact resistance of the electrically connected structures on the second N-type semiconductor layer 14).

Figure 9:
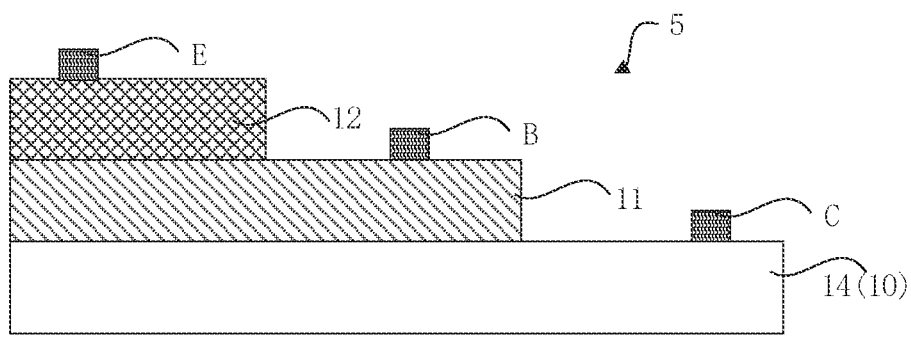
FIG. 9 is a structural schematic diagram illustrating a semiconductor structure according to a sixth embodiment of the present disclosure.

FIG. 9 is a structural schematic diagram illustrating a semiconductor structure according to a sixth embodiment of the present disclosure. The semiconductor structure 5 of the sixth embodiment is substantially the same as the semiconductor structure 4 of the fifth embodiment. The difference between the two is that: the exposed second N-type semiconductor layer 14 has a collector electrode C, the P-type semiconductor layer 11 has a base electrode B, and the first N-type semiconductor layer 12 has an emitter electrode E.

There is an ohmic contact between the collector electrode C and the second N-type semiconductor layer 14, between the base electrode B and the P-type semiconductor layer 11, and between the emitter electrode E and the first N-type semiconductor layer 12.

The materials of the collector electrode C, the base electrode B, and the emitter electrode E may all be metals or semiconductor materials with good conductivity after doping.

Figure 10:
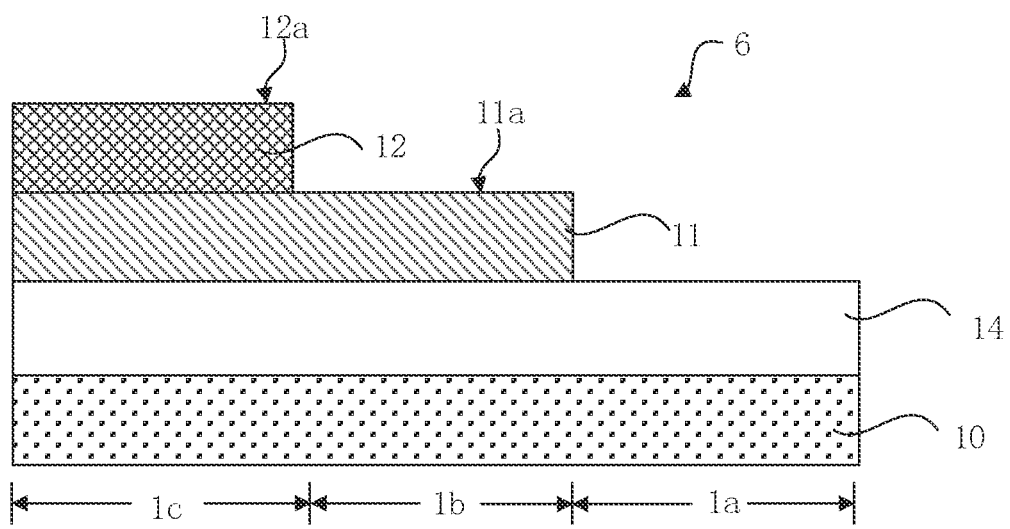
FIG. 10 is a structural schematic diagram illustrating a semiconductor structure according to a seventh embodiment of the present disclosure.

FIG. 10 is a structural schematic diagram illustrating a semiconductor structure according to a seventh embodiment of the present disclosure. Referring to FIG. 10, the semiconductor structure 6 of the seventh embodiment is substantially the same as the semiconductor structure 5 of the sixth embodiment and the semiconductor structure 4 of the fifth embodiment except that the semiconductor structure 6 further includes a second N-type semiconductor layer 14 and the second N-type semiconductor layer 14 is located on the semiconductor substrate 10.

The method of forming the second N-type semiconductor layer 14 on the semiconductor substrate 10 may be a MOCVD method. This embodiment does not limit an orientation of GaN covalent bond in the second N-type semiconductor layer 14.

Although the present disclosure is made as above, the present disclosure is not limited hereto. Various changes and modifications may be made by those skilled in the art without departing from the spirit and scope of the present disclosure. Therefore, the scope of the present disclosure shall be defined by the claims.

The invention claimed is:

1. A manufacturing method of a semiconductor structure, the method comprising:
providing a P-type semiconductor layer, wherein the P-type semiconductor layer comprises a first GaN-based material and a first upper surface of the P-type semiconductor layer is a Ga surface;
forming a first N-type semiconductor layer on the P-type semiconductor layer, wherein the first N-type semiconductor layer comprises a second GaN-based material, and a second upper surface of the first N-type semiconductor layer is an N surface; and
removing a first part of the first N-type semiconductor layer by wet etching to expose a second part of the P-type semiconductor layer.

2. The manufacturing method of claim 1, wherein before the first N-type semiconductor layer is formed on the P-type semiconductor layer, the method further comprises:
activating P-type doped ions in the P-type semiconductor layer.

3. The manufacturing method of claim 1, wherein the P-type semiconductor layer is located on a second N-type semiconductor layer and the first part of the first N-type semiconductor layer which is removed by wet etching is located in a base electrode region;
the method further comprising:
removing the first N-type semiconductor layer in a collector electrode region and the P-type semiconductor layer in the collector electrode region by dry etching to expose a third part of the second N-type semiconductor layer.

4. The manufacturing method of claim 1, wherein providing the P-type semiconductor layer comprises:
providing a semiconductor substrate, forming a second N-type semiconductor layer on the semiconductor substrate, and forming the P-type semiconductor layer on the second N-type semiconductor layer; or
providing a second N-type semiconductor layer, and forming the P-type semiconductor layer on the second N-type semiconductor layer.

5. The manufacturing method of claim 3, further comprising:
forming a collector electrode on the second N-type semiconductor layer of the collector electrode region;
forming a base electrode on the P-type semiconductor layer of the base electrode region; and
forming an emitter electrode on the first N-type semiconductor layer of an emitter electrode region.

6. The manufacturing method of claim 1, wherein the first N-type semiconductor layer with the upper surface is an N surface formed on the P-type semiconductor layer by:
directly bonding a first Ga surface of the first N-type semiconductor layer with a second Ga surface of the P-type semiconductor layer.

7. The manufacturing method of claim 1, wherein the first N-type semiconductor layer with the upper surface is an N surface formed on the P-type semiconductor layer by:
enabling the N surface of the first N-type semiconductor layer to face upward through polarity inversion in a process of forming the first N-type semiconductor layer.

8. A semiconductor structure, manufactured by the manufacturing method according to claim 1, and comprising:
a P-type semiconductor layer and a first N-type semiconductor layer distributed from bottom to top, wherein,
the P-type semiconductor layer comprises a first GaN-based material, and a first upper surface of the P-type semiconductor layer is a Ga surface;
the first N-type semiconductor layer comprises a second GaN-based material, and a second upper surface of the first N-type semiconductor layer is an N surface; and
a part of the Ga surface of the P-type semiconductor layer is exposed.

9. The semiconductor structure of claim 8, further comprising a second N-type semiconductor layer, wherein,
the P-type semiconductor layer is located on the second N-type semiconductor layer; and
the second N-type semiconductor layer in a collector electrode region and the P-type semiconductor layer in a base electrode region are exposed.

10. The semiconductor structure of claim 9, further comprising:
  a collector electrode on the exposed second N-type semiconductor layer,
  a base electrode on the exposed P-type semiconductor layer, and
  an emitter electrode on the first N-type semiconductor layer.

\* \* \* \* \*